United States Patent
LaMeres et al.

(10) Patent No.: US 7,046,020 B2
(45) Date of Patent: May 16, 2006

(54) PROBES WITH PERPENDICULARLY DISPOSED SPRING PINS, AND METHODS OF MAKING AND USING SAME

(75) Inventors: Brock J. LaMeres, Colorado Springs, CO (US); Brent A. Holcombe, Colorado Springs, CO (US); Kenneth Johnson, Colorado Springs, CO (US)

(73) Assignee: Agilent Technologies, Inc., Palo Alto, CA (US)

( * ) Notice: Subject to any disclaimer, the term of this patent is extended or adjusted under 35 U.S.C. 154(b) by 0 days.

(21) Appl. No.: 10/781,086

(22) Filed: Feb. 17, 2004

(65) Prior Publication Data

US 2005/0179454 A1    Aug. 18, 2005

(51) Int. Cl.
   *G01R 31/02*   (2006.01)
(52) U.S. Cl. ...................... 324/754; 324/761
(58) Field of Classification Search ........ 324/754–762, 324/73.1, 158.1; 439/482, 82
   See application file for complete search history.

(56) References Cited

U.S. PATENT DOCUMENTS

| 4,232,928 | A | * | 11/1980 | Wickersham | 439/42 |
| 4,528,500 | A | * | 7/1985 | Lightbody et al. | 324/537 |
| 4,724,377 | A | * | 2/1988 | Maelzer et al. | 324/149 |
| 4,743,839 | A | * | 5/1988 | Rush | 324/72.5 |
| 4,837,507 | A | * | 6/1989 | Hechtman | 324/758 |
| 4,912,400 | A | * | 3/1990 | Plante | 324/754 |
| 4,963,822 | A | * | 10/1990 | Prokopp | 324/758 |
| 5,157,325 | A | * | 10/1992 | Murphy | 324/761 |
| 5,172,051 | A | * | 12/1992 | Zamborelli | 324/72.5 |
| 5,223,787 | A | | 6/1993 | Smith et al. | |
| 5,534,787 | A | * | 7/1996 | Levy | 324/761 |
| 6,046,597 | A | * | 4/2000 | Barabi | 324/755 |
| 6,150,830 | A | * | 11/2000 | Schmid et al. | 324/761 |
| 6,575,772 | B1 | | 6/2003 | Soubh et al. | |
| 6,822,466 | B1 | * | 11/2004 | Holcombe et al. | 324/761 |
| 6,867,609 | B1 | * | 3/2005 | Holcombe et al. | 324/754 |

FOREIGN PATENT DOCUMENTS

EP          0513992 A1 *  6/1992

OTHER PUBLICATIONS

Brent A. Holcombe, et al., U.S. Appl. No. 10/373,820, "Connector-Less Probe", 20 pages of specification and eight- (8) sheets of drawings (Fig. 1-7), Filed Feb. 25, 2003.

(Continued)

*Primary Examiner*—Jermele Hollington (57) ABSTRACT

A probe for probing test points on a target board uses a printed circuit board (PCB) having a plurality of signal routes for routing signals to a test instrument. The probe also has a plurality of spring pins for probing the test points on the target board. Each of the spring pins is i) disposed perpendicularly to the PCB, and ii) electrically coupled to at least one signal route of the PCB. By way of example, the spring pins may be fit into holes in the PCB or, alternately, they may be electrically coupled to signal routes of a second PCB that is perpendicularly abutted to the first PCB. Methods for making and using such probes are also disclosed.

16 Claims, 5 Drawing Sheets

OTHER PUBLICATIONS

Brent A. Holcombe, et al., U.S. Appl. No. 10/644,365, "Alignment/Retention Device for Connector-Less Probe", 14 pages of specification and five- (5) sheets of drawings (Figs. 1-4C), Filed Aug. 20, 2003.

www.agilent.com, "Soft Touch Connectorless Ligic Analyzer Probes", Agilent models E5387A, E5390A, and E5394A, Jun. 5, 2003, 2 pages.

* cited by examiner

PROBES WITH PERPENDICULARLY DISPOSED SPRING PINS, AND METHODS OF MAKING AND USING SAME

BACKGROUND

Connector-less probing has emerged as an attractive form of probing for logic analyzers and other test equipment. In connector-less probing, a customer designs their printed circuit board (PCB) to incorporate a "landing pattern" of test points. The customer then attaches a connector-less probe to their test equipment, and mounts the connector-less probe to their PCB so that a plurality of spring-pins on the probe engage the plurality of test points in their PCB's landing pattern.

One embodiment of a connector-less probe is disclosed in the United States Patent Application of Brent A. Holcombe, et al. entitled "Connector-Less Probe" (Ser. No. 10/373,820, filed Feb. 25, 2003 now U.S. Pat. No. 6,867,609). An alignment/retention device for mounting a connector-less probe to a PCB is disclosed in the United States Patent Application of Brent A. Holcombe, et al. entitled "Alignment/Retention Device For Connector-Less Probe" (Ser. No. 10/644,365, filed Aug. 20, 2003 now U.S. Pat. No. 6.822466).

Agilent Technologies, Inc. (headquartered in Palo Alto, Calif.) markets a number of connector-less probing solutions under the name "Soft Touch".

SUMMARY

One aspect of the invention is embodied in a probe for probing test points on a target board. The probe comprises a PCB, and a plurality of spring pins for probing the test points on the target board. The PCB has a plurality of signal routes for routing signals to a test instrument, and each of the spring pins is i) disposed perpendicularly to the PCB, and ii) electrically coupled to at least one signal route of the PCB.

Another aspect of the invention is embodied in a method for forming a probe. The method comprises forming a row of vias in a first PCB. The first PCB is then cut along the row of vias, thereby exposing cross-sections of the vias at a "cut edge" of the first PCB. Next, a plurality of spring pins are electrically coupled to a plurality of signal routes of the first PCB. The signal routes, in turn, are electrically coupled to ones of the vias. The spring pins are coupled to the first PCB such that their probe tips extend beyond an edge of the first PCB that is opposite the PCB's "cut edge". Finally, the cut edge of the first PCB is abutted to a second PCB, and the signal routes of the first PCB are electrically coupled to signal routes of the second PCB (by means of the via cross-sections) such that the first PCB extends perpendicularly from the second PCB.

Yet another aspect of the invention is embodied in a method for probing test points on a target board. The method comprises selecting a test probe having a plurality of spring pins that are arranged perpendicularly to a main body portion of the test probe. The main body portion of the probe comprises a first PCB to which the plurality of spring pins are electrically coupled. After selecting such a probe, the probe is moved over the target board to seat an alignment mechanism of the test probe to a corresponding alignment mechanism of the target board. Pressure is then applied to at least one of the test probe or target board to cause the plurality of spring pins to engage the test points on the target board. Signals are then routed from the test points via the test probe.

Other embodiments of the invention are also disclosed.

BRIEF DESCRIPTION OF THE DRAWINGS

Illustrative and presently preferred embodiments of the invention are illustrated in the drawings, in which.

DESCRIPTION OF THE INVENTION

Connector-less probing provides both electrical and mechanical advantages over traditional probing. Electrically, connector-less probing provides for the placement of tip-network components closer to where signals are being sampled. This reduces electrical loading on a target board and provides higher signal fidelity to a test instrument. Mechanically, connector-less probing eliminates a customer's need to provide test connectors on each of their PCBs. Rather, test access is merely provided by designing a board to include a landing pattern of test points. Also, unlike the larger and more intrusive footprints that are needed for connector mounting, the footprints needed for connector-less probing are smaller and less intrusive. This makes it easier to incorporate connector-less probe landing patterns on both prototype and production boards (while only minimally or not at all impacting the functionality of the production boards).

A disadvantage of currently available connector-less probes is their vertical space requirement. That is, the bodies of currently available connector-less probes extend substantially perpendicular from a target board's landing pattern. However, at times, a customer needs to test a board in an environment with little Z-axis access to the board's landing pattern (e.g., a landing pattern on a motherboard mounted inside of a chassis). Under such circumstances, it is difficult if not impossible to mount a connector-less probe to the landing pattern. Connector-less probes that can be maneuvered in environments with little Z-axis would therefore be desirable.

FIGS. 1 & 3–7 illustrate various connector-less probes 100, 500 for probing test points on a target board. Each of the probes 100, 500 comprises a main body portion defined by a PCB 102, 502, with each PCB 100, 500 having a plurality of signal routes 104, 106, 504, 506 (thereon or therein) for routing signals to a test instrument (e.g., via one or more ribbon cables 120). As used herein, the term "signal route" encompasses both PCB traces, and components that may be coupled to or formed within signal traces.

Figure 1:
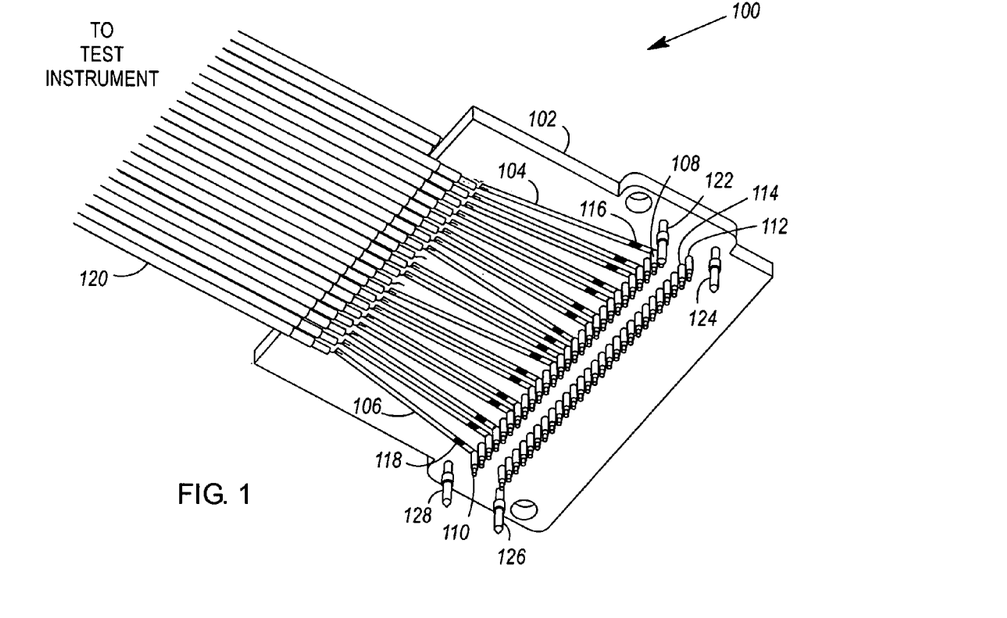
FIG. 1 illustrates a perspective view of a first exemplary test probe.
Figure 5:
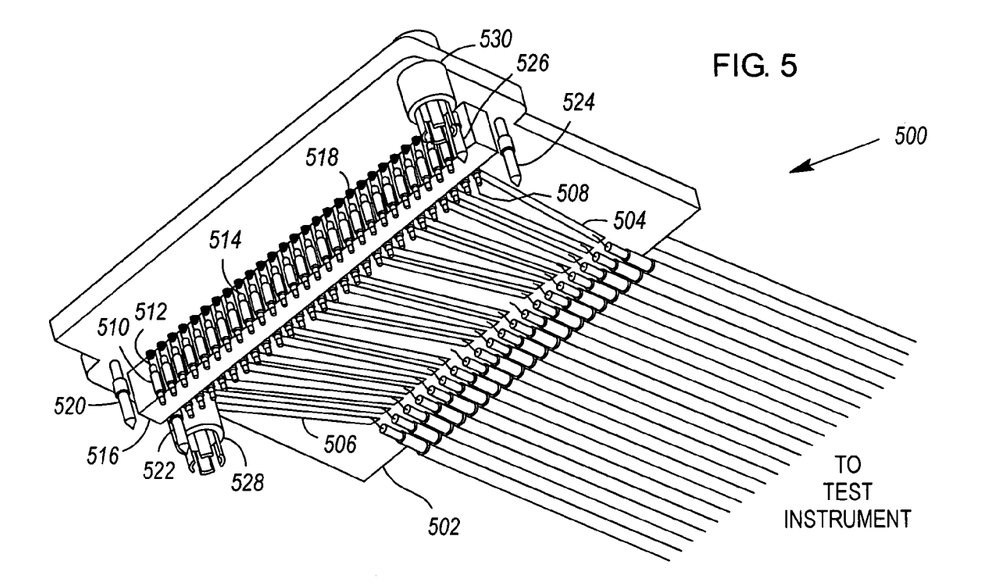
FIG. 5 illustrates a perspective view of a second exemplary test probe.

Each probe 100, 500 also comprises a plurality of spring pins 108, 110, 508, 510 for probing test points on a target board. The spring pins 108, 110, 508, 510 of each probe 100, 200 are disposed perpendicularly to the probe's PCB 102, 502, with each spring pin 108, 110, 508, 510 being electrically coupled to at least one signal route 104, 106, 504, 506 of the probe's PCB 102, 502 (possibly by means of other components and/or signal routes 512, 514).

Figure 3:
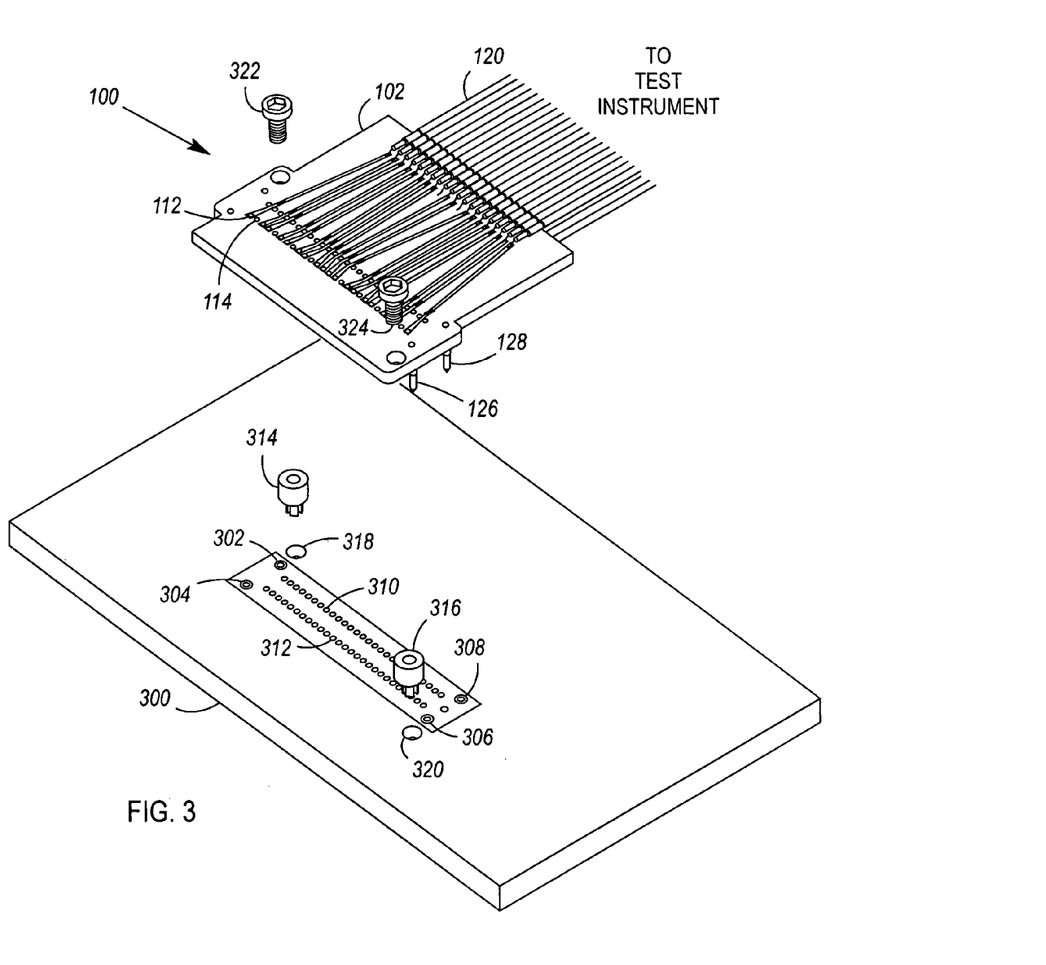
FIG. 3 illustrates exemplary mechanisms for aligning and securing the test probe to a PCB.

As shown in FIGS. 1 & 3, the PCB 102 forming the main body portion of a test probe 100 may have a plurality of holes 112, 114 formed therein. Each of the probe's plurality of spring pins 108, 110 may then be inserted into one of the holes 112, 114. In one embodiment, each of the holes 112, 114 frictionally engages the body of a spring pin 108, 110 that is inserted therein. Once inserted into its hole 112, a spring pin 108 may be soldered to one of the signal routes 104 of the PCB 102. To facilitate such soldering, each of the holes 112, 114 may be plated with a metal that is wettable by solder, or each hole 112, 114 may be encircled by a plated ring or pad that is coupled to one of the PCB's signal routes 104, 106.

Figure 2:
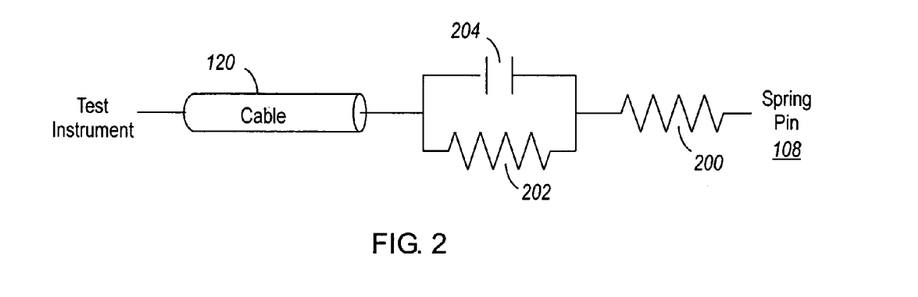
FIG. 2 illustrates an exemplary embodiment of the probe tip-network of the FIG. 1 test probe.

Each of the signal routes 104, 106 of the PCB 102 may comprise one or more tip-network components 116, 118 that are preferably positioned adjacent the probe's spring pins 108, 110. By way of example, and as shown in FIG. 2, the tip-network components 116, 118 of each signal route 104, 106 may comprise an isolation resistor 200, as well as a tip resistor 202 connected in parallel with a tip capacitor 204. The combination of the tip resistor 202 and tip capacitor 204 may be coupled in series with the isolation resistor 200.

Figure 4:
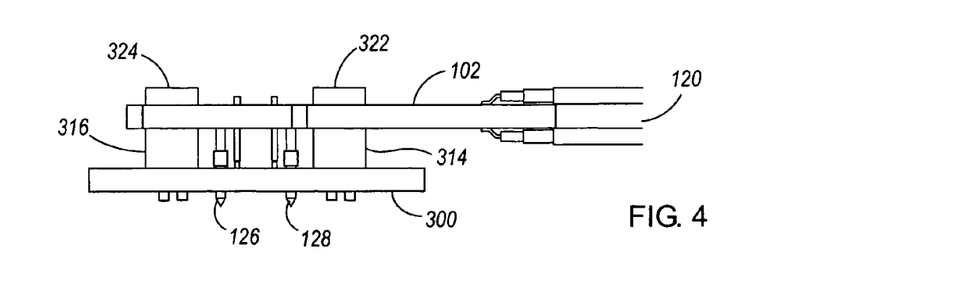
FIG. 4 illustrates an elevation of the FIG. 1 test probe, secured to the FIG. 3 PCB.

The probe 100 may further comprise an alignment mechanism, such as a plurality of alignment pins 122, 124, 126, 128. Each of the alignment pins 122–128 may be attached to the PCB 102 in the same manner that the spring pins 108, 110 are attached to the PCB 102. However, the alignment pins 122–128 need not be electrically coupled to any signal route 104, 106 on the PCB 102 (although it might be advantageous to couple them to ground). As shown in FIGS. 3 & 4, if a target board 300 is manufactured with a corresponding alignment mechanism (e.g., a pattern of holes 302, 304, 306, 308 that complements the pattern of alignment pins 122–128 on the probe 100), then the spring pins 108, 110 of the probe 100 can be aligned with the test points 310, 312 of the target board 300 prior to pressure being applied to the probe 100 and/or target board 300 to engage the spring pins 108, 110 with the test points 310, 312. Such an alignment step is useful in that too many repositionings of the probe 100 while its spring pins 108, 110 are engaged may cause the spring pins 108, 110 to bend, weaken or even break.

The probe 100 may also comprise a mechanism 314, 316 for securing the probe to a target board 300. As shown in FIGS. 3 & 4, this securing mechanism may be attached to the PCB 102. In one embodiment, the securing mechanism may comprise a plurality of rivets 314, 316 that releasably snap to holes 318, 320 in the target board 300. The rivets 314, 316 may be attached to the PCB 102 using screws 322, 324 that extend through the PCB 102 and screw into tops of the rivets 314, 316.

FIG. 5 illustrates an alternate embodiment of a connectorless probe. As shown in FIG. 5, the probe 500 may comprise a second PCB 516, with at least some of the plurality of spring pins 508, 510 being electrically coupled to signal routes 512, 514 of the second PCB 516 such that their probe tips extend beyond a first edge of the second PCB 516. Although FIG. 5 shows spring pins 508, 510 attached to two, opposite surfaces of the second PCB 516, the spring pins 508, 510 could alternately be attached to only one side of the second PCB 516.

After attaching spring pins 508, 510 to the second PCB 516, the second PCB 516 is abutted perpendicularly to the main body (or first) PCB 502 such that an edge of the second PCB 516 opposite the first edge (or the edge over which the probe tips of the spring pins 508, 510 extend) is abutted to the first PCB 502. The signal routes 512, 514 of the second PCB 502 are then electrically coupled to the signal routes 504, 506 of the first PCB 502.

Figure 6:
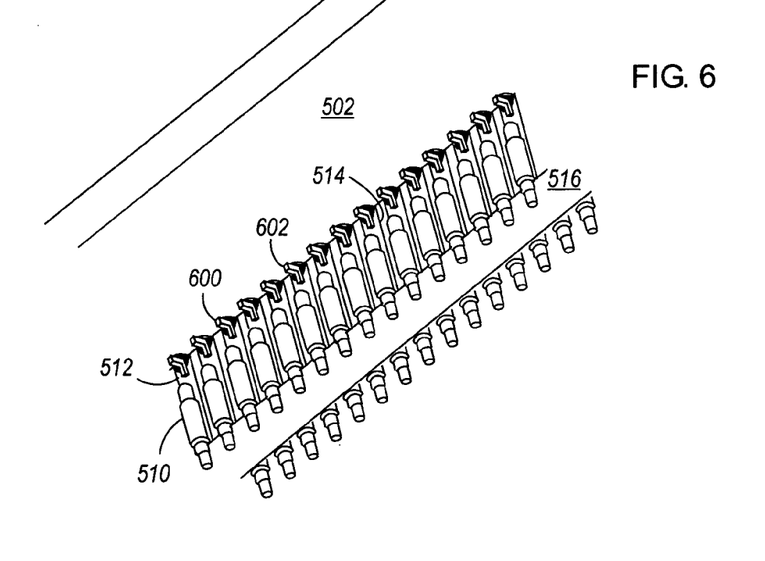
FIG. 6 illustrates an alternative means for electrically coupling the first and second PCBs of the FIG. 5 test probe.
Figure 7:
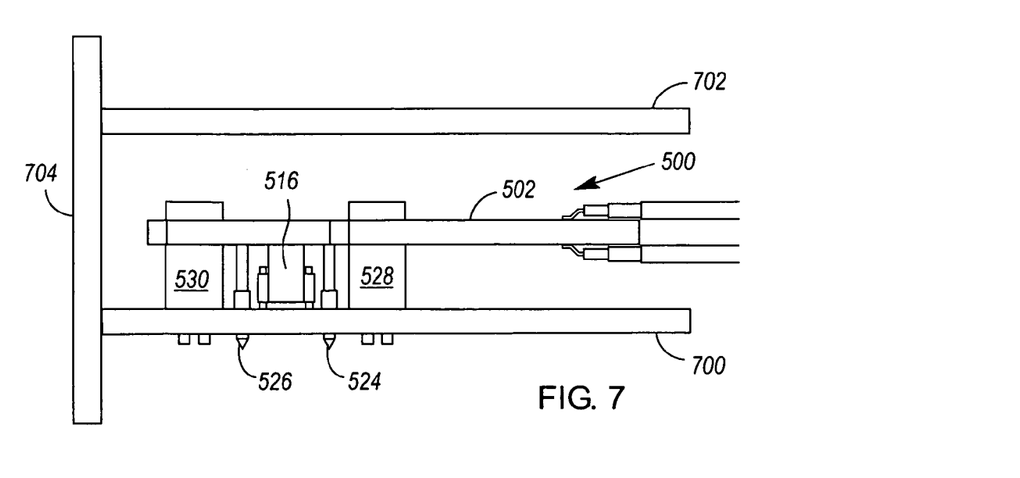
FIG. 7 illustrates an elevation of the FIG. 5 test probe, secured to a PCB.

There are a number of ways in which the signal routes 512, 514 of the first and second PCBs 502, 516 may be coupled. In one embodiment, a plurality of bonding pads are formed on one surface of the first PCB 502, with each bonding pad being electrically coupled to one of the signal routes 504, 506 of the first PCB 502. A plurality of edge pads are then formed on the second PCB 516, with each edge pad being electrically coupled to one of the signal routes 512, 514 of the second PCB 516. Corresponding ones of the bonding pads and edge pads are then electrically coupled to each other via solder 518, conductive paste, or other means. The pads may be coupled directly to one another or, as shown in FIG. 6, may be coupled to each other by means of bridge elements, such as wire solder legs 600, 602. Depending on the size and construction of the second PCB assembly, bridge elements such as wire solder legs 600, 602 may provide more stability to the second PCB 516 when the probe 500 is in use.

In one embodiment of the probe 500, the edge pads of the second PCB 516 may comprise plated ends of the signal routes 512, 515 of the second PCB 516. In another embodiment, the edge pads may comprise extended, bent surface pads of the second PCB 516. In yet another embodiment, the edge pads may comprise exposed vias of the second PCB 516. A method for creating such "exposed vias" is illustrated in FIG. 8, and will be discussed in greater detail later in this description.

As with the probe shown in FIG. 1, the signal routes of the probe 500 shown in FIG. 5 may comprise one or more tip-network components. However, in the probe shown in FIG. 5, the tip-network components are preferably included within the signal routes 512, 514 of the second PCB 516. In this manner, the tip-network components may once again be positioned adjacent the probe's spring pins 508, 510. However, if the height of the second PCB 516 does not provide enough space for the tip-network components, the tip-network components can alternately be moved to the first PCB 502.

The probe 500 shown in FIG. 5 may also comprise alignment and securing mechanisms 520, 522, 524, 526, 528, 530, each of which may operate similarly to the mechanisms of the probe 100.

Figure 8:
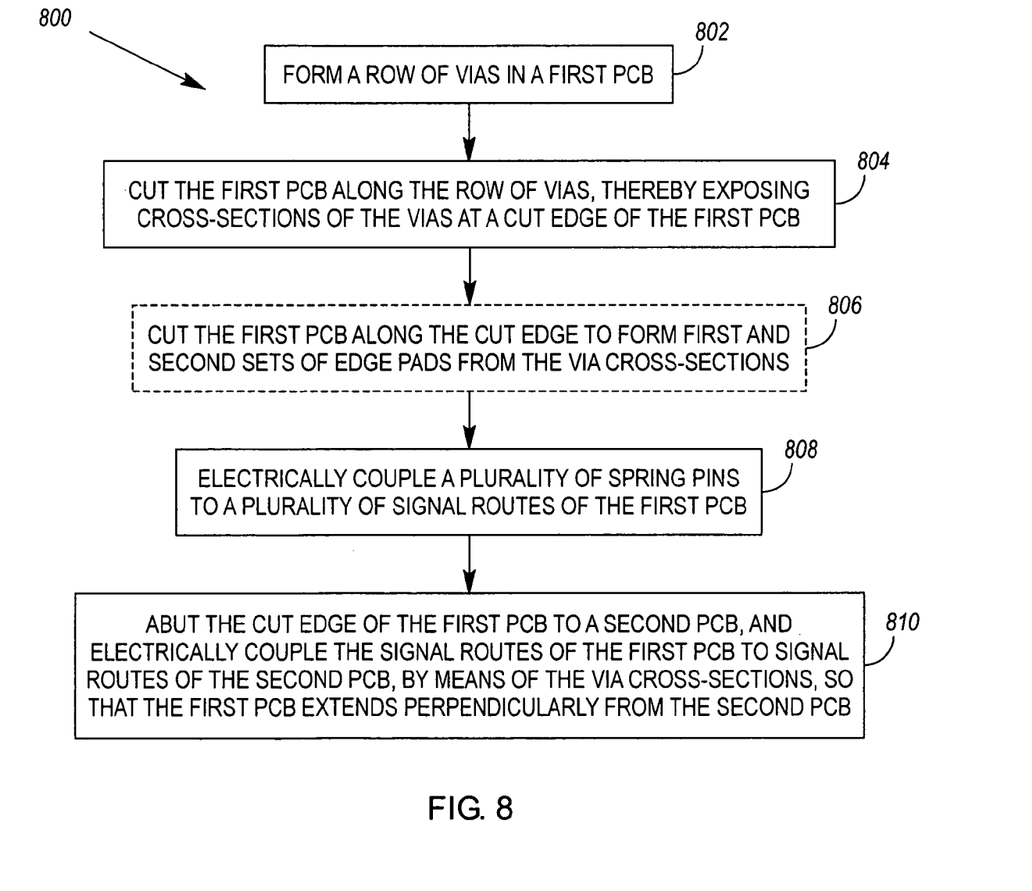
FIG. 8 illustrates an exemplary method for making one of the PCBs of the FIG. 5 test probe.
Figure 9:
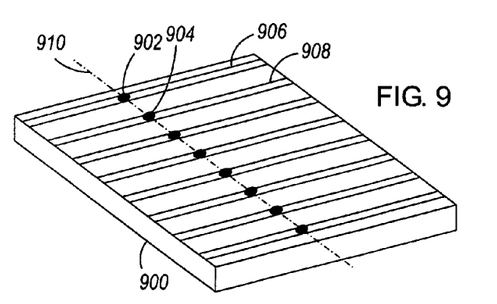
FIGS. 9–11 illustrate a PCB at various stages of the FIG. 8 method.

As previously alluded to, FIG. 8 illustrates a method 800 for forming a probe comprising first and second perpendicularly attached PCBs. The method 800 begins with the formation 802 of a row of vias 902, 904 in a first of the PCBs 900 (see FIG. 9). Each of the vias 902, 904 is formed so that it intersects with a signal route 906, 908 of the PCB 900. After forming the row of vias 902, 904, the PCB 900 is cut 804 along the row of vias 902, 904, thereby exposing cross-sections of the vias at a "cut edge" of the PCB 900 (i.e., an edge formed at cut-line 910). By way of example, the PCB 900 may be cut using a laser or saw.

Figure 10:
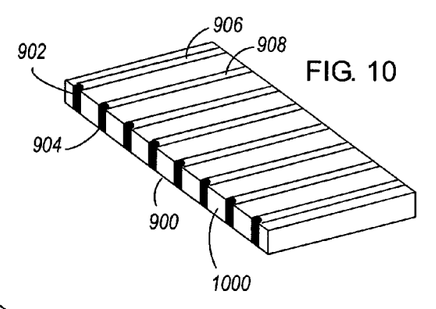
Figure 11:
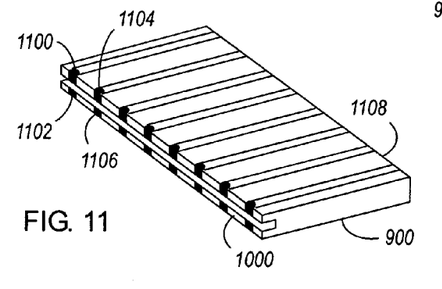

As shown in FIG. 10, the exposed via cross-sections 902, 904 may be coupled to a plurality of signal routes 906, 908 formed on only one surface of the PCB 900. Alternately, each via cross-section could be coupled to a signal route on either surface of the PCB 900; or each via cross-section could be coupled to signal routes on both surfaces of the PCB 900. In the latter case, it may be necessary to form two edge pads 1100, 1102, 1104, 1106 from each of the exposed via cross-sections 902, 904. This may be done by cutting 806 the PCB 900 along its cut edge 1000 (see FIG. 11).

The FIG. 8 method continues with the electrical coupling 808 of a plurality of spring pins to ones of the signal routes of the PCB 900. The spring pins are coupled to the signal routes such that their probe tips extend beyond an edge 1108 of the PCB 900 opposite its cut edge 1000. Thereafter, the cut edge 1000 of the PCB 900 is abutted 810 to a second PCB, and corresponding signal routes of the first and second PCBs are electrically coupled to one another by means of the via cross-sections of the first PCB. In this manner, the first PCB extends perpendicularly from the second PCB, as shown in FIG. 5.

Figure 12:
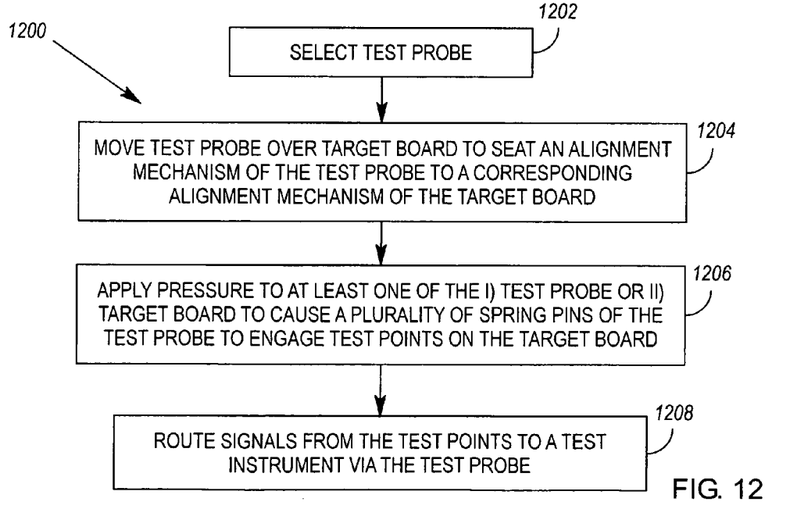
FIG. 12 illustrates an exemplary method for using either of the test probes illustrated in FIGS. 1 & 5.

FIG. 12 illustrates an exemplary method 1200 for probing test points on a target board. The method begins with the selection 1202 of a test probe comprising a plurality of spring pins that are arranged perpendicularly to a main body portion of the test probe (with the main body portion of the probe comprising a PCB to which the plurality of spring pins are electrically coupled. By way of example, the method is satisfied by selecting any of the probes that have been disclosed herein.

After the selection of a suitable probe, the probe is moved 1204 over the target board to seat an alignment mechanism of the probe to a corresponding alignment mechanism of the target board. Pressure is then applied 1206 to the test probe and/or target board to cause the plurality of spring pins to engage the target board's test points. Optionally, enough pressure may be applied to cause a securing mechanism of the probe to engage securing mechanism of the target board. Thereafter, signals are routed 1208 from the test points to a test instrument via the test probe.

Although the method shown in FIG. 12 may be used in various environments, and under various conditions, it is especially useful in environments where there is little Z-axis access to a target board's test points. See, for example, the environment shown in FIG. 7, wherein a probe 500 needs to be maneuvered over a target board 700. Due to the close proximity of board 702 which, together with target board 700 is mounted to backplane 704, there is very little Z-axis access to target board 700. In such an environment, the main body portion of a selected probe 500, including the main body PCB 502, may be moved along a path that is substantially parallel to the target board 700—unlike the bodies of conventional probes that are configured to extend substantially perpendicular from a target board.

While illustrative and presently preferred embodiments of the invention have been described in detail herein, it is to be understood that the inventive concepts may be otherwise variously embodied and employed, and that the appended claims are intended to be construed to include such variations, except as limited by the prior art.

What is claimed is:

1. A probe for probing test points on a target board, comprising:
    a first printed circuit board (PCB) having a plurality of signal routes for routing signals to a test instrument;
    a plurality of spring pins for probing the test points on the target board, each spring pin of which is i) disposed perpendicularly to the first PCB, and ii) electrically coupled to at least one signal route of the first PCB; and
    a second PCB having a plurality of signal routes, wherein:
        i) at least some of the plurality of spring pins are electrically coupled to the signal routes of the second PCB such that their probe tips extend beyond a first edge of the second PCB; ii) the second PCB is abutted perpendicularly to the first PCB, with an edge of the second PCB opposite said first edge being abutted to the first PCB; and iii) the signal routes of the second PCB are electrically coupled to the signal routes of the first PCB.

2. The probe of claim 1, wherein:
    the first PCB comprises a plurality of bonding pads on one surface thereof, each of which is electrically coupled to one of the signal routes of the first PCB;
    the second PCB comprises a plurality of edge pads abutting the first PCB, each of which is electrically coupled to one of the signal routes of the second PCB; and
    corresponding ones of the bonding pads and edge pads are electrically coupled to each other.

3. The probe of claim 2, wherein said edge pads comprise plated ends of said signal routes of the second PCB.

4. The probe of claim 2, wherein said edge pads comprise an extended, bent surface pad of the second PCB.

5. The probe of claim 2, wherein said edge pads comprise exposed vias of the second PCB.

6. The probe of claim 2, wherein corresponding ones of the bonding pads and edge pads are electrically coupled via solder.

7. The probe of claim 2, wherein corresponding ones of the bonding pads and edge pads are electrically coupled via wire solder legs.

8. The probe of claim 1, wherein bodies of the plurality of spring pins are soldered to signal routes on opposite surfaces of the second PCB.

9. The probe of claim 1, wherein said signal routes of the second PCB comprise tip-network components positioned adjacent said spring pins.

10. The probe of claim 9, wherein said tip-network components comprise isolation resistors.

11. A method for forming a probe, comprising:
    forming a row of vias in a first PCB;
    cutting said first PCB along said row of vias, thereby exposing cross-sections of said vias at a cut edge of said first PCB;
    electrically coupling a plurality of spring pins to a plurality of signal routes of the first PCB, wherein said signal routes of the first PCB are electrically coupled to ones of said vias, and wherein said spring pins are electrically coupled to the first PCB such that their probe tips extend beyond an edge of said first PCB opposite said cut edge;
    abutting said cut edge of said first PCB to a second PCB, and electrically coupling said signal routes of the first PCB to signal routes of the second PCB, by means of said via cross-sections, so that said first PCB extends perpendicularly from said second PCB.

12. The method of claim 11, wherein ones of said via cross-sections are coupled to signal routes on first and second opposite sides of the first PCB, the method further comprising:
    cutting said first PCB along said cut edge to form first and second sets of edge pads from said via cross-sections; and
    electrically coupling said edge pads to said signal routes of the second PCB.

13. A method for probing test points on a target board, comprising:

selecting a test probe comprising a plurality of spring pins that are arranged perpendicularly to a main body portion of the test probe, said main body portion comprising a first printed circuit board (PCB) to which the plurality of spring pins are electrically coupled;

moving the test probe over the target board to seat an alignment mechanism of the test probe to a corresponding alignment mechanism of the target board;

applying pressure to at least one of the i) test probe or ii) target board to cause the plurality of spring pins to engage the test points on the target board; and routing signals from the test points to a test instrument via the test probe.

14. The method of claim 13, further comprising, while applying said pressure, applying enough pressure to cause a securing mechanism of the test probe to engage a securing mechanism of the target board.

15. The method of claim 13, wherein said moving comprises moving said first PCB along a path that is substantially parallel to said target board.

16. The method of claim 13, wherein the spring pins of the selected test probe are electrically coupled to traces of a second PCB that is perpendicularly attached to the first PCB.

* * * * *